(12) United States Patent
Kawada et al.

(10) Patent No.: US 10,032,724 B2
(45) Date of Patent: Jul. 24, 2018

(54) SILICON CARBIDE SEMICONDUCTOR BASE, METHOD OF CRYSTAL AXIS ALIGNMENT IN SILICON CARBIDE SEMICONDUCTOR BASE, AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Yasuyuki Kawada, Tsukuba (JP); Takeshi Tawara, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/634,656

(22) Filed: Jun. 27, 2017

(65) Prior Publication Data

US 2018/0061960 A1    Mar. 1, 2018

(30) Foreign Application Priority Data

Aug. 31, 2016   (JP) .................................. 2016-170347

(51) Int. Cl.

| H01L 29/04 | (2006.01) |
| H01L 29/161 | (2006.01) |
| H01L 29/78 | (2006.01) |
| H01L 23/544 | (2006.01) |
| H01L 21/66 | (2006.01) |

(Continued)

(52) U.S. Cl.
CPC ...... *H01L 23/544* (2013.01); *H01L 21/02378* (2013.01); *H01L 21/02433* (2013.01); *H01L 21/02529* (2013.01); *H01L 21/049* (2013.01); *H01L 21/0475* (2013.01); *H01L 22/12* (2013.01); *H01L 29/045* (2013.01); *H01L 29/1608* (2013.01); *H01L 29/4236* (2013.01); *H01L 29/66045* (2013.01);

(Continued)

(58) Field of Classification Search
CPC ......... H01L 21/02378; H01L 21/02433; H01L 21/02529; H01L 21/02609; H01L 21/0445; H01L 21/0475; H01L 29/045; H01L 29/1608; H01L 23/544; H01L 2223/54426; H01L 2223/54493; H01L 22/12

See application file for complete search history.

(56) References Cited

U.S. PATENT DOCUMENTS

| 5,929,482 A | 7/1999 | Kawakami et al. |
| 2001/0048142 A1 | 12/2001 | Urakami et al. |
| 2010/0187543 A1* | 7/2010 | Kawada ............ H01L 29/66068 257/77 |

FOREIGN PATENT DOCUMENTS

| JP | H11-135512 A | 5/1999 |
| JP | 2001-332462 A | 11/2001 |

* cited by examiner

*Primary Examiner* — Robert Bachner
*Assistant Examiner* — Molly Reida
(74) *Attorney, Agent, or Firm* — Rabin & Berdo, P.C.

(57) ABSTRACT

On a first epitaxial layer of a first conductivity type or a second conductivity type provided on a front surface of a silicon carbide substrate, a mark indicating a crystal axis direction of the silicon carbide substrate within a margin of error of one degree is provided. The mark is created on the silicon carbide substrate by forming the first epitaxial layer of the first conductivity type or the second conductivity type on the front surface of the silicon carbide substrate, detecting a stacking fault from the first epitaxial layer, and confirming the crystal axis direction of the silicon carbide substrate from the detected stacking fault.

11 Claims, 9 Drawing Sheets

(51) Int. Cl.
*H01L 21/20* (2006.01)
*H01L 21/336* (2006.01)
*H01L 29/66* (2006.01)
*H01L 29/16* (2006.01)
*H01L 21/04* (2006.01)
*H01L 29/423* (2006.01)
*H01L 21/02* (2006.01)
*H01L 29/739* (2006.01)

(52) U.S. Cl.
CPC ...... *H01L 29/7397* (2013.01); *H01L 29/7813* (2013.01); *H01L 2223/54493* (2013.01)

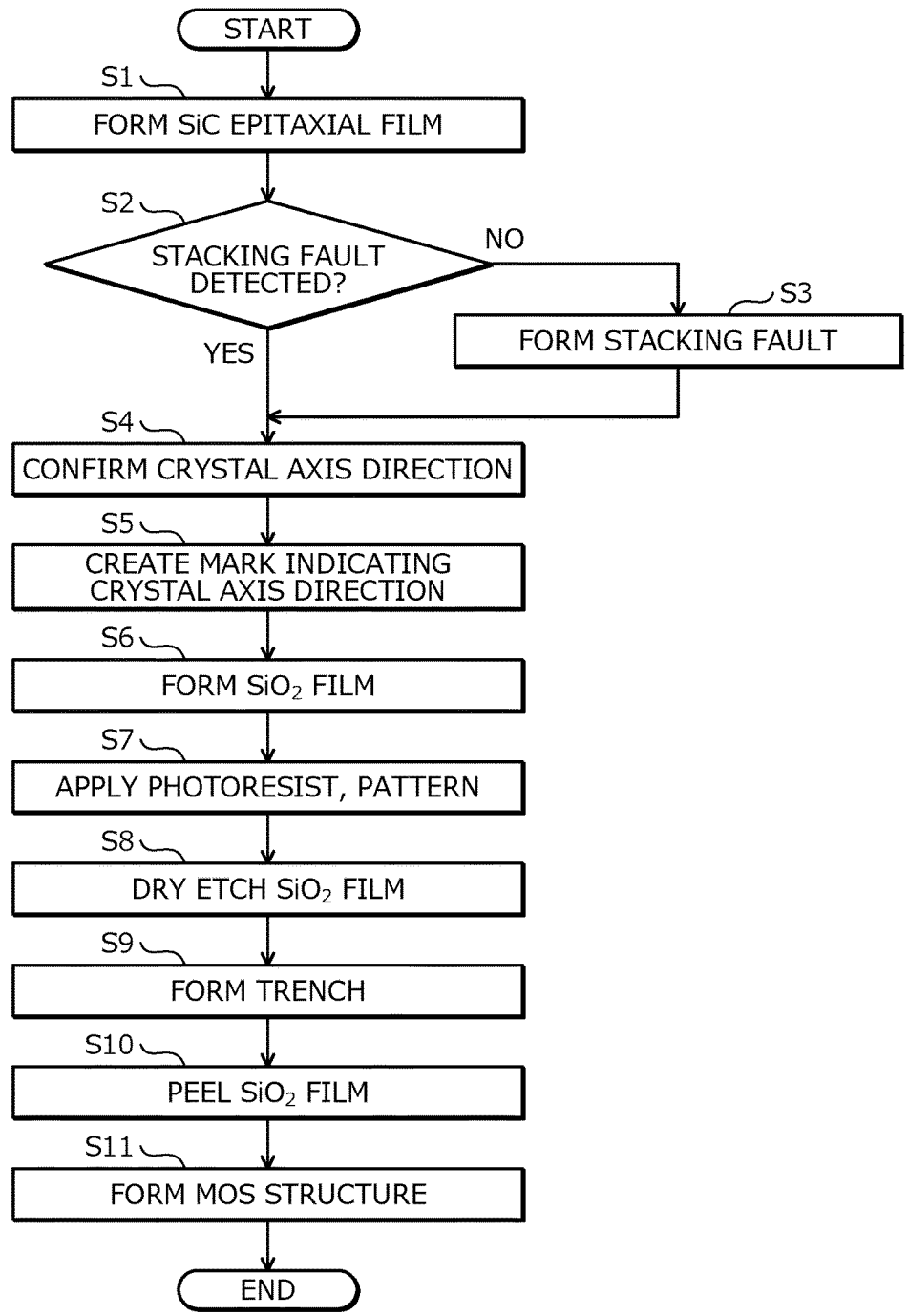

SILICON CARBIDE SEMICONDUCTOR BASE, METHOD OF CRYSTAL AXIS ALIGNMENT IN SILICON CARBIDE SEMICONDUCTOR BASE, AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2016-170347, filed on Aug. 31, 2016, the entire contents of which are incorporated herein by reference.

BACKGROUND OF THE INVENTION

1. Field of the Invention

Embodiments of the invention relate to a silicon carbide semiconductor base, a method of crystal axis alignment in a silicon carbide semiconductor base, and a method of manufacturing a silicon carbide semiconductor device.

2. Description of the Related Art

Various types of power semiconductor elements, bipolar transistors, insulated gate bipolar transistors (IGBTs), metal oxide semiconductor field effect transistors (MOSFETs), and the like can be produced (manufactured) using silicon carbide (SiC).

Conventionally, when various patterns are formed on a silicon carbide substrate surface containing a 4-layer periodic hexagonal SiC (4H—SiC), a pattern is formed using, as a reference, a crystal axis direction <11-20> indicated by a primary orientation flat (hereinafter, the primary OF) of the SiC wafer. For example, when a vertical MOSFET having a trench structure is produced, a sidewall of the trench is formed in a direction parallel to the primary OF. In the present description, when Miller indices are described, "-" means a bar added to an index immediately after the "-", and a negative index is expressed by prefixing "−" to the index.

According to one technique, for example, in a semiconductor substrate, by forming an orientation flat cut along a (−111) plane or a (1-1-1) plane orthogonal to a (110) plane, a side surface of the trench may be easily put in the (−111) plane or the (1-1-1) plane (refer to Japanese Laid-Open Patent Publication No. 2001-332462). Further, according to another technique, any one of the crystal axes orthogonal to a crystal axis forming a normal direction of a surface of a silicon wafer is set as the normal direction of the orientation flat and a longitudinal direction of the trench is set to be parallel to the normal direction of the orientation flat, or parallel to the other crystal axis direction orthogonal to the normal direction (refer to Japanese Laid-Open Patent Publication No. H11-135512).

SUMMARY OF THE INVENTION

According to one aspect of the invention, a silicon carbide semiconductor base includes an epitaxial layer formed on a front surface of a silicon carbide substrate, the epitaxial layer containing a silicon carbide of a first conductivity type or a second conductivity type. A mark is provided in the epitaxial layer, the mark indicating a crystal axis direction of the silicon carbide substrate within a margin of error of one degree.

In the silicon carbide semiconductor base, the mark indicates the crystal axis direction of the silicon carbide substrate within a margin of error of 0.5 degrees.

In the silicon carbide semiconductor base, the mark is provided at an end of the silicon carbide substrate.

In the silicon carbide semiconductor base, a poly-type of the silicon carbide substrate is 4H—SiC using Ramsdell notation, having an ABCB stacking sequence.

According to another aspect of the invention, a method of crystal axis alignment in a silicon carbide semiconductor base, includes forming an epitaxial layer on a front surface of a silicon carbide substrate, the epitaxial layer containing a silicon carbide of a first conductivity type or a second conductivity type; performing detection of a stacking fault from the epitaxial layer; confirming a crystal axis direction of the silicon carbide substrate from a detected stacking fault; and creating a mark indicating the confirmed crystal axis direction.

According to this method, upon detection, when no stacking fault is detected, the epitaxial layer is damaged and irradiated with ultraviolet rays so that a stacking fault appears.

A site of the damage is within a predetermined distance from a secondary orientation flat provided at a position orthogonal to the primary orientation flat that indicates the crystal axis direction of the semiconductor substrate.

The crystal axis direction of the silicon carbide substrate is confirmed using one edge of the stacking fault as a reference.

According to another aspect of the invention, a method of manufacturing a silicon carbide semiconductor device, includes forming a first epitaxial layer on a front surface of a silicon carbide substrate, the first epitaxial layer containing a silicon carbide of a first conductivity type; forming a second epitaxial layer on a first side of the first epitaxial layer opposite a second side of the first epitaxial layer, the second side facing the silicon carbide substrate, the second epitaxial layer containing a silicon carbide of a second conductivity type; detecting a stacking fault from the second epitaxial layer; confirming a crystal axis direction of the silicon carbide substrate from the detected stacking fault; creating a mark indicating the confirmed crystal axis direction; selectively forming a first semiconductor region of the first conductivity type, in the second epitaxial layer, the first semiconductor region having an impurity concentration higher than that of the first epitaxial layer; forming a trench penetrating the first semiconductor region and the second epitaxial layer, and reaching the first epitaxial layer; forming in the trench, a gate electrode provided via a gate insulating film; forming a first electrode to contact the first semiconductor region and the second epitaxial layer; and forming a second electrode on a rear surface of the silicon carbide substrate. In forming the trench, a sidewall of the trench is formed parallel to the crystal axis direction, based on the mark indicating the crystal axis direction.

Objects, features, and advantages of the present invention are specifically set forth in or will become apparent from the following detailed description of a non-limiting embodiment of the invention when read in conjunction with the accompanying drawings.

BRIEF DESCRIPTION OF THE DRAWINGS

FIG. 2 is a flowchart outlining a method of crystal axis alignment in a silicon carbide semiconductor base according to the embodiment;

DETAILED DESCRIPTION OF THE INVENTION

Figure 1A:
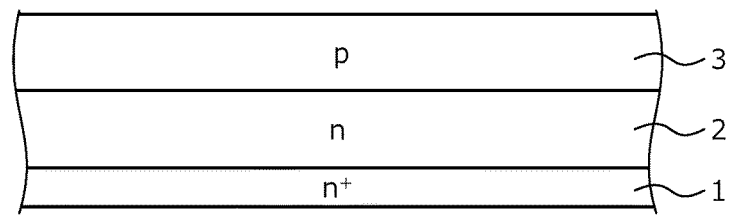
FIG. 1A is a cross-sectional view of a structure of a silicon carbide semiconductor base according to an embodiment.

Embodiments of a silicon carbide semiconductor base, a method of crystal axis alignment in a silicon carbide semiconductor base, and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. In the description of the embodiments below and the accompanying drawings, main portions that are identical will be given the same reference numerals and will not be repeatedly described.

Figure 1B:
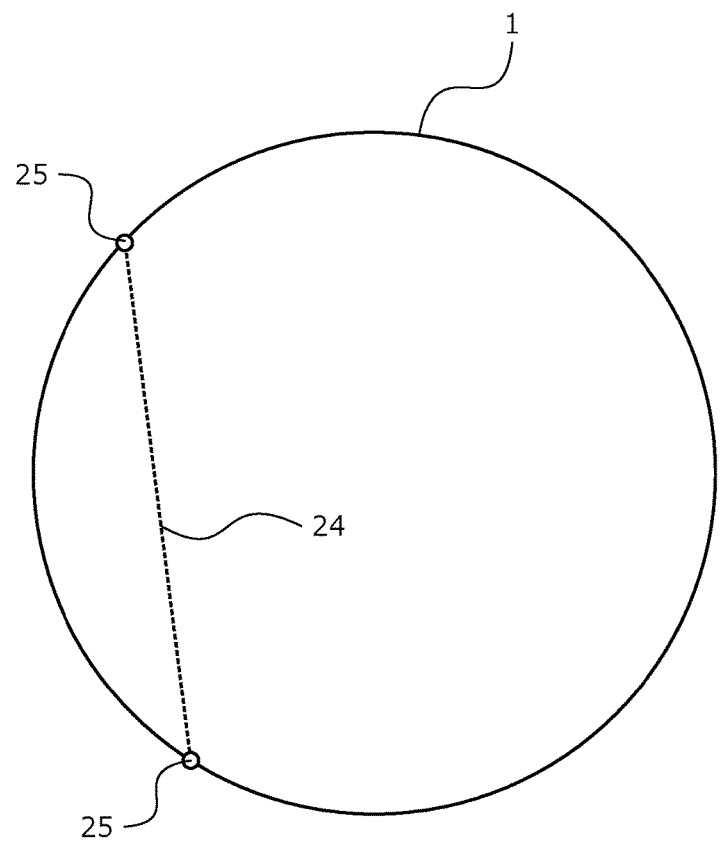
FIG. 1B is a top view of the silicon carbide semiconductor base according to the embodiment.

FIGS. 1A and 1B depict a cross-sectional view and a top view of a structure of the silicon carbide semiconductor base according to an embodiment. FIG. 1A is a cross-sectional view of the structure of the silicon carbide semiconductor base. The silicon carbide semiconductor base is a semiconductor wafer formed by forming a silicon carbide semiconductor layer by epitaxial growth on an $n^+$-type semiconductor substrate (hereinafter, $n^+$-type silicon carbide substrate) 1 containing a silicon carbide of 4H—SiC. Alternatively, the silicon carbide semiconductor base is a semiconductor chip cut from the semiconductor wafer. In particular, as depicted in FIG. 1A, the silicon carbide semiconductor base is formed by sequentially forming on the $n^+$-type silicon carbide substrate 1 by epitaxial growth, silicon carbide layers forming an n-type drift layer 2 and a p-type base layer 3.

FIG. 1B is a top view of the silicon carbide semiconductor base. The silicon carbide semiconductor base is provided with a mark indicating a crystal axis direction <11-20> of the $n^+$-type silicon carbide substrate 1. For example, marks 25 are provided indicating the crystal axis direction <11-20> of the $n^+$-type silicon carbide substrate 1 within a 1-degree margin of error, more preferably, within 0.5 degrees. In FIG. 1B, a line 24 connecting the two points of the marks 25, for example, is parallel or orthogonal to the crystal axis direction <11-20> of the $n^+$-type silicon carbide substrate 1 and the crystal axis direction <11-20> of the $n^+$-type silicon carbide substrate 1 may be confirmed by the line 24. In FIG. 1B, although two points are provided as the marks 25, the marks may be of another shape provided that the crystal axis direction may be confirmed. For example, a straight line indicating the crystal axis direction may be created as the mark.

The method of crystal axis alignment in a silicon carbide semiconductor base according to the embodiment will be described with reference to FIGS. 2 to 11. FIG. 2 is a flowchart outlining the method of crystal axis alignment in a silicon carbide semiconductor base according to the embodiment. FIG. 3 and FIGS. 6, 7, 8, 9, 10, and 11 are cross-sectional views of a silicon carbide semiconductor device during manufacture in the method of crystal axis alignment in a silicon carbide semiconductor base according to the embodiment.

First, a SiC epitaxial film is formed on the $n^+$-type silicon carbide substrate 1 containing 4H—SiC (step S1). For example, as the SiC epitaxial film, the n-type drift layer (first epitaxial layer) 2 and the p-type base layer (second epitaxial layer) 3 are formed as follows. The $n^+$-type silicon carbide substrate 1 is subjected to an organic solvent ultrasonic cleaning process, a RCA cleaning process (wet cleaning using strong acid and highly basic solution), or the like to prepare a sufficiently clean surface. Next, on a main surface (Si-face) or a rear surface (C-face) of the $n^+$-type silicon carbide substrate 1, an n-type impurity, for example, boron (B) or aluminum (Al), gallium (Ga), indium (In), thallium (Tl), or the like is doped, forming the n-type drift layer 2 by epitaxial growth.

Figure 3:
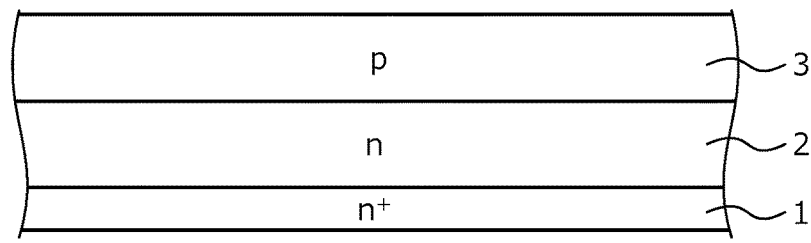
FIG. 3 is a cross-sectional view (part 1) of a silicon carbide semiconductor device during manufacture in the method of crystal axis alignment in a silicon carbide semiconductor base according to the embodiment.

Next, on the n-type drift layer 2, a p-type impurity, for example, nitrogen (N) or phosphorus (P), arsenic (As), antimony (Sb), or the like is doped, forming the p-type base layer 3 to a thickness of, for example, 10 μm by epitaxial growth. The state up to here is depicted in FIG. 3.

Figure 4:
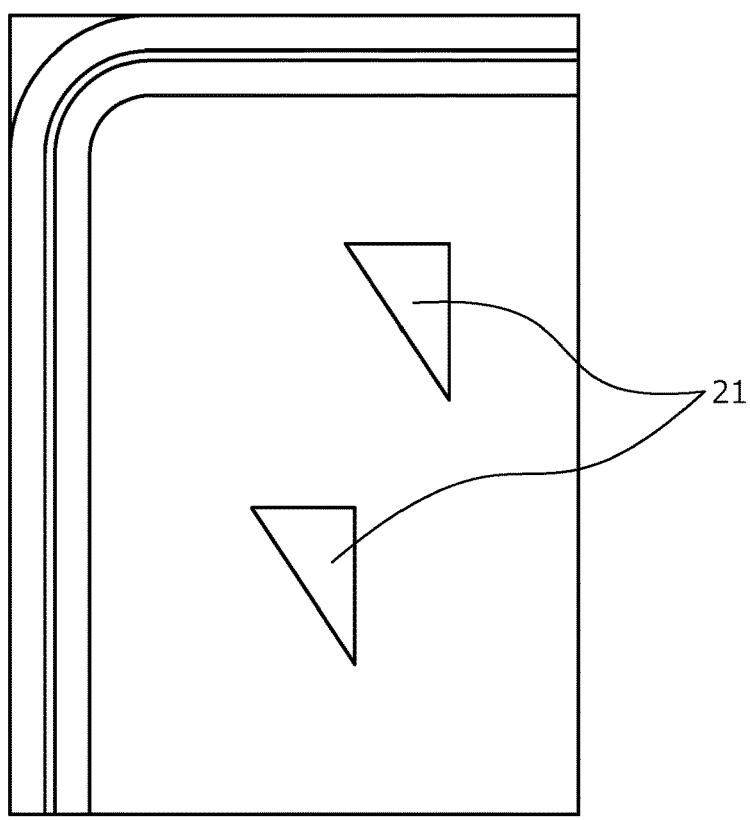
FIG. 4 is an image depicting a stacking fault in the silicon carbide semiconductor base according to the embodiment.

Next, whether a stacking fault of a triangular shape or a band shape from the SiC epitaxial film is detected is confirmed (step S2). A stacking fault is detected by observing the entire SiC wafer using a photoluminescence (PL) imaging device to detect a stacking fault of a triangular shape or a band shape from the SiC epitaxial film. For example, photoluminescence is photographed by the PL imaging device and stacking faults are detected from the captured image. FIG. 4 is an image depicting a stacking fault in the silicon carbide semiconductor base according to the embodiment. In FIG. 4, two stacking faults 21 of a triangular shape are confirmed to exist.

When a stacking fault is detected (step S2: YES), the process proceeds to step S4. On the other hand, when no stacking fault is detected (step S2: NO), a stacking fault is formed in the SiC epitaxial film (step S3). For example, a surface of a wafer end portion may be damaged and irradiated with high intensity UV (ultra violet rays) of an intensity of a few 10 W/cm² to intentionally cause a band-shaped stacking fault or a triangular-shaped defect. Here, the wafer end portion is a periphery of the wafer where no semiconductor chip is formed on the SiC wafer. Therefore, even if a stacking fault is formed, the semiconductor chip is not affected. In particular, preferably, a damage site may be a predetermined distance, for example, within 10 mm, from a secondary orientation flat 26 (refer to FIG. 5) provided at a position orthogonal to the primary OF. This is because a stacking fault occurring from damage includes a band-shaped stacking fault extending orthogonally to the primary OF and thus, the damage site may be preferably near both the left and right edges of a SiC wafer having the primary OF as below.

Further, various devices may be used for damaging the SiC epitaxial film. For example, the SiC epitaxial film may be indented using an ultrafine hardness measuring instrument (nano indenter) to cause damage, the SiC epitaxial film may be scratched using a diamond pen to cause damage.

Next, a crystal axis direction of the $n^+$-type silicon carbide substrate 1 is confirmed (step S4). One edge of a stacking fault on the SiC epitaxial film appears reflecting a crystal axis direction. In particular, one edge of the stacking fault is orthogonal to the crystal axis direction <11-20>. Therefore, from one edge of the stacking fault, the crystal axis direction <11-20> may be confirmed accurately. Therefore, providing a mark so as to indicate one edge of a stacking fault detected at step S2 or formed at step S3 enables the crystal axis direction <11-20> of the $n^+$-type silicon carbide substrate 1 to be confirmed. For example, providing a mark within an error of 1 degree so as to indicate one edge of a stacking fault enables the crystal axis direction <11-20> of the $n^+$-type silicon carbide substrate 1 to be indicated within a 1-degree margin of error by the mark. More preferably, providing a mark within an error of 0.5 degrees so as to indicate one edge of a stacking fault enables the crystal axis direction <11-20> of the $n^+$-type silicon carbide substrate 1 to be indicated within a 0.5-degree margin of error by the mark.

Figure 5:
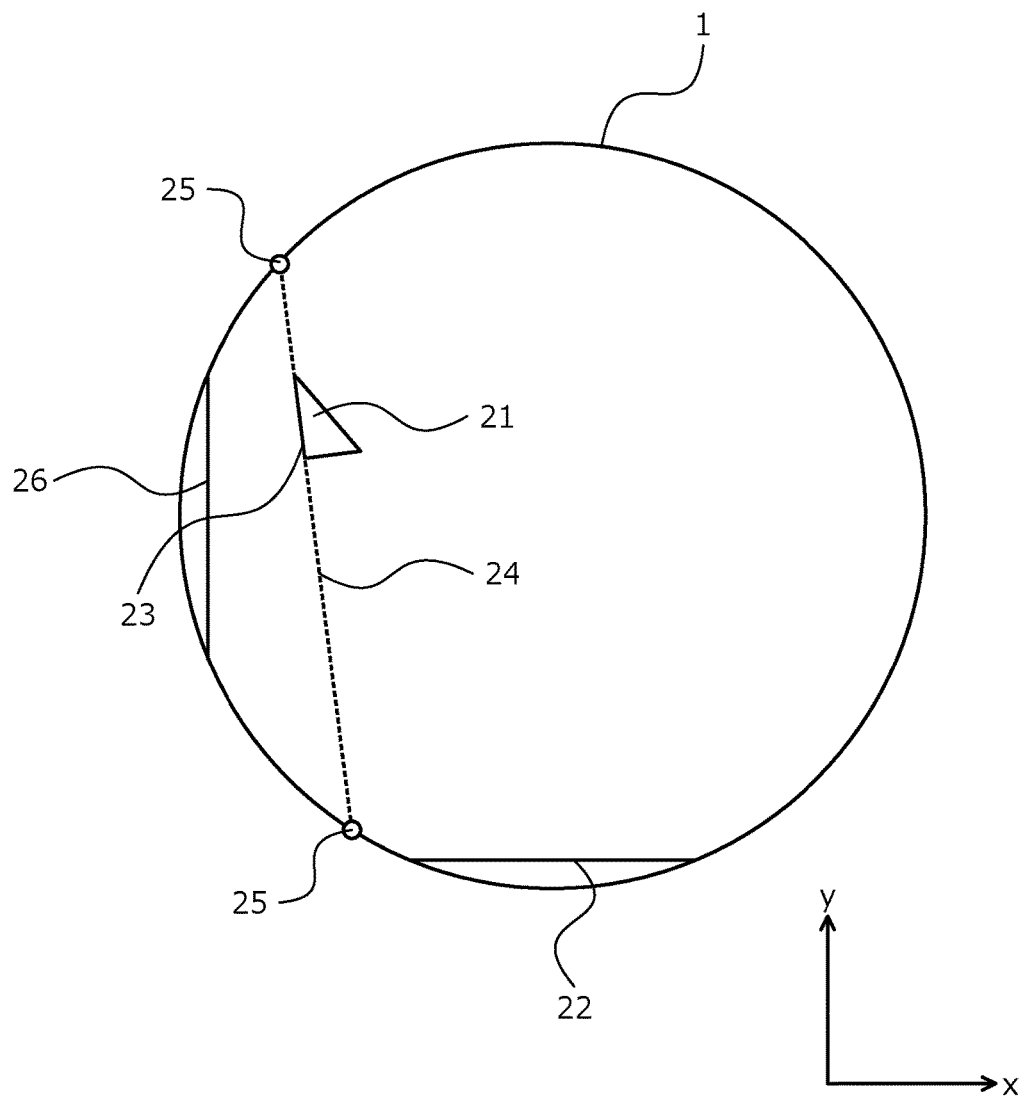
FIG. 5 is an image of an example of confirmation of crystal axis direction by the method of crystal axis alignment in a silicon carbide semiconductor base according to the embodiment.

FIG. 5 is an image of an example of confirmation of crystal axis direction by the method of crystal axis alignment in a silicon carbide semiconductor base according to the embodiment. In the confirmation of crystal axis direction, first, a primary OF 22 is used to get a general idea of the direction of the crystal axis direction <11-20>. In FIG. 5, the crystal axis direction <11-20> is found to be an x axis direction by the primary OF 22. Next, an edge of a stacking fault orthogonal to the crystal axis direction <11-20> is confirmed. One edge of a stacking fault is orthogonal to the crystal axis direction <11-20> and therefore, among the edges of the stacking fault, the edge closest to the general direction is the edge orthogonal to the crystal axis direction <11-20>. For example, in FIG. 4, since the crystal axis direction <11-20> is the x axis direction, among the edges of the stacking fault 21, the edge close to the y axis orthogonal to the x axis is an edge 23. In this manner, the crystal axis direction <11-20> may be confirmed. Although FIG. 5 depicts an example of a triangular stacking fault, in a case of a band-shaped stacking fault, the crystal axis direction may be confirmed from one edge of the band-shape.

Next, a mark indicating the crystal axis direction is created (step S5). For example, based on the crystal axis direction confirmed at step S4, a mark is created at the wafer end portion by laser or the like. In the example depicted in FIG. 5, on a dotted line 24 extending the edge 23 in the wafer end portion, two points are created as the marks 25. In FIG. 5, although marks are created on the dotted line 24 extending the edge 23, configuration is not limited hereto. For example, marks may be created on a line parallel to the dotted line 24 extending the edge 23.

Figure 6:
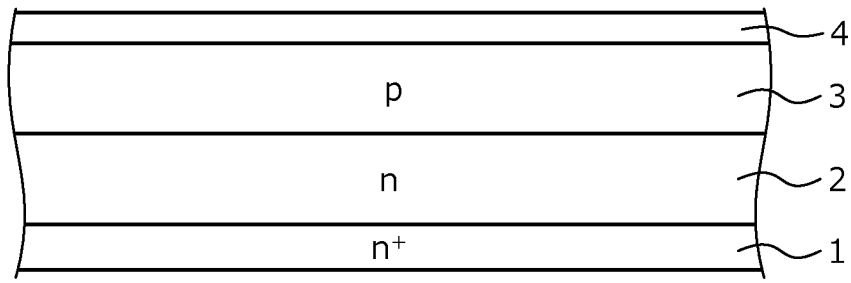
FIGS. 6, 7, 8, 9, 10, and 11 are cross-sectional views (parts 2 to 7) of the silicon carbide semiconductor device during manufacture in the method of crystal axis alignment in a silicon carbide semiconductor base according to the embodiment.

Next, a silicon oxide ($SiO_2$) film 4 is formed (step S6). For example, the $SiO_2$ film 4 is formed on the p-type base layer 3 by plasma chemical vapor deposition (CVD) or the like. The thickness is a thickness necessary for use as a mask in dry etching patterning for trench formation. For example, the thickness of the $SiO_2$ film 4 is a thickness that will not disappear with dry etching. The state up to here is depicted in FIG. 6.

Figure 7:
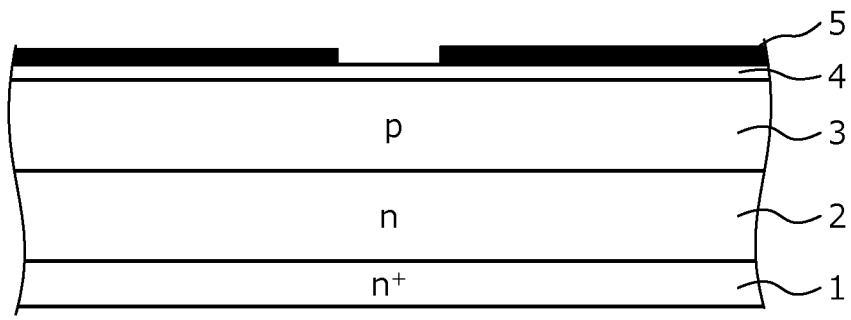

Next, a photoresist 5 is applied and patterned (step S7). For example, the photoresist 5 is applied on the $SiO_2$ film 4 and luminously exposed with a photomask, thereby patterning a trench portion. Here, based on the marks created at step S5 and indicating the crystal axis direction <11-20>, the angle is aligned so that the mask pattern does not deviate from the crystal axis direction <11-20> of the $n^+$-type silicon carbide substrate 1. The state up to here is depicted in FIG. 7.

Figure 8:
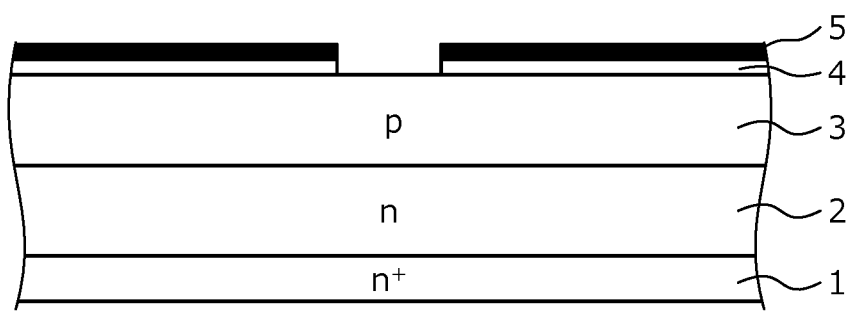

Next, the $SiO_2$ film 4 is dry etched (step S8). For example, the photoresist 5 is used as a mask and the $SiO_2$ film 4 is dry etched until the p-type base layer 3 is exposed. The state up to here is depicted in FIG. 8.

Figure 9:
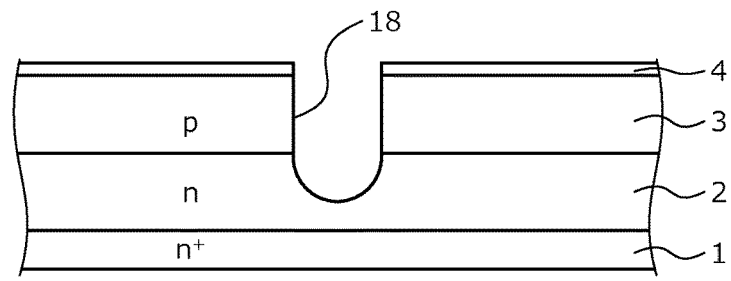

Next, a trench 18 is formed (step S9). For example, the photoresist 5 is peeled, the patterned $SiO_2$ film 4 is used as a mask and to a desired depth, for example, penetrating the p-type base layer 3, to a depth reaching the n-type drift layer 2, dry etching is performed, forming the trench 18. Further, after the trench etching, isotropic etching for removing damage of the trench 18 and hydrogen annealing for rounding corners of the opening the trench 18 and the bottom of the trench may be performed. Further, processing may be such that only one of isotropic etching and hydrogen annealing is performed. Further, hydrogen annealing may be performed after performing isotropic etching. The state up to here is depicted in FIG. 9.

Figure 10:
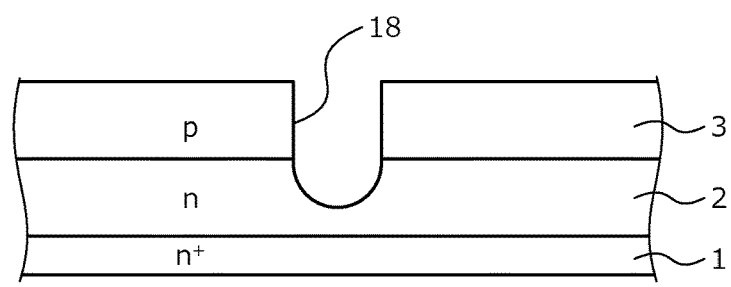

Next, the $SiO_2$ film 4 is peeled (step S10). For example, the $SiO_2$ film 4 of the mask is peeled by hydrogen fluoride (HF) or the like, and the $n^+$-type silicon carbide substrate 1 is cleaned well. By the processes up to here, the sidewall of the trench 18 may be formed along a direction parallel to the crystal axis direction <11-20> of the $n^+$-type silicon carbide substrate 1. Therefore, at the sidewall of the trench 18, an m-face is exposed without exposure of an a-face. The state up to here is depicted in FIG. 10.

Next, a MOS structure is formed (step S11). For example, manufacturing processes required by respective devices such as a MOSFET, super junction (SJ) transistor, IGBT, or the like are performed. In particular, when a MOSFET is manufactured, manufacturing processes are as follows.

First, a $p^{++}$-type contact region 8 is selectively formed in a surface layer of the p-type base layer 3 by photolithography and ion implantation of a p-type impurity. For example, a dose amount at the time of ion implantation for forming the $p^{++}$-type contact region 8 may be set so that the impurity concentration becomes about $3 \times 10^{20}/cm^3$.

Next, an $n^{++}$-type source region (first semiconductor region) 7 is selectively formed in the surface layer of the p-type base layer 3 by photolithography and ion implantation of an n-type impurity, the $n^{++}$-type source region 7 is formed to contact the $p^{++}$-type contact region 8. For example, a dose amount at the time of ion implantation for forming the $n^{++}$-type source region 7 may be set so that the impurity concentration becomes about $3 \times 10^{20}/cm^3$. The formation sequence of the $n^{++}$-type source region 7 and the $p^{++}$-type contact region 8 may be interchanged. The $n^{++}$-type source region 7 and the $p^{++}$-type contact region 8 may be formed before the trench 18.

Next, a gate insulating film 9 is formed along a front surface of the silicon carbide semiconductor base and an inner wall of the trench 18. Next, for example, a poly-silicon is deposited and etched so as to be embedded in the trench 18 whereby the poly-silicon remains, becoming a gate electrode 10 inside the trench 18. Here, etching may be performed so that poly-silicon farther inside than a base surface portion remains, or the poly-silicon may be cause to protrude to the outside from the base surface portion by patterning and etching.

Next, an interlayer insulating film 11 is formed on the entire front surface of the silicon carbide semiconductor base, covering the gate electrode 10. The interlayer insulating film 11, for example, is formed using a non-doped silicate glass (NSG), a phospho silicate glass (PSG), a boro phosphor silicate glass (BPSG), a high-temperature oxide (HTO), or a combination thereof. Next, the interlayer insulating film 11 and the gate insulating film 9 are patterned and a contact hole is formed, exposing the $n^{++}$-type source region 7 and the $p^{++}$-type contact region 8.

Next, a barrier metal is formed so as to cover the interlayer insulating film 11 and is patterned to again expose the $n^{++}$-type source region 7 and the $p^{++}$-type contact region 8. Next, a source electrode 12 is formed to contact the $n^{++}$-type source region 7. The source electrode (first electrode) 12 may be formed so as to cover the barrier metal, or may be left only in the contact hole.

Figure 11:
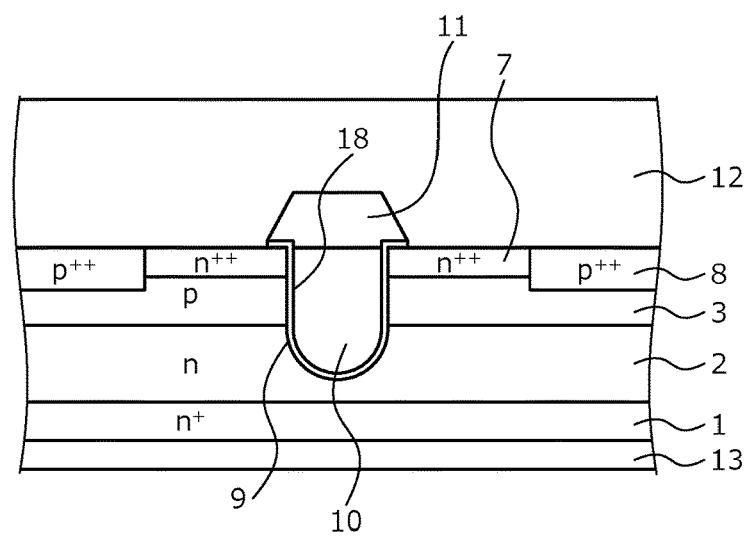

Next, a source electrode pad is formed so as to be embedded in the contact hole. A portion of a metal layer deposited to form the source electrode pad may be used as a gate pad. On a rear surface of the $n^+$-type silicon carbide substrate 1, a metal film such as a nickel (Ni) film, a titanium (Ti) film, and the like is formed at a contact portion of a drain electrode 13 using a sputtering deposition method. This metal film may be a stacked combination of plural Ni and Ti films. Thereafter, annealing such as rapid thermal annealing (RTA) is performed such that the metal film is converted into a silicide and forms an ohmic contact. Thereafter, for example, a thick film such as a stacked film formed by sequentially depositing a Ti film, a Ni film, and gold (Au) is formed by electron beam (EB) deposition to form the drain electrode (second electrode) 13. Thus, the MOSFET depicted in FIG. 11 is completed.

In the embodiment above, although a trench of a vertical MOSFET is described as one of various patterns formed on the silicon carbide substrate surface, the invention is applicable to patterns other than a trench. For example, in a planar MOSFET, when a striped structure is formed, the direction of the striped structure may be confirmed based on the marks indicating the crystal axis direction <11-20>.

Further, although the damage for causing a stacking fault and the marks indicating the crystal axis direction are described to be formed at a wafer end portion, each may be formed at a wafer center portion. In this case, the portion having the marks or damage is not used in dicing.

As described above, according to the embodiment, on a silicon carbide semiconductor base, a mark is provided indicating the crystal axis direction <11-20> of the silicon carbide substrate within a 1-degree margin of error, more preferably with a 0.5-degree margin of error. Based on this mark, various patterns may be formed on the silicon carbide substrate surface. When a trench pattern is formed based on this mark, for example, the trench pattern may be formed parallel to the crystal axis direction <11-20> with sufficiently high accuracy. Therefore, only an m-face appears at the sidewall of the trench without the appearance of an a-face, mobility of the sidewall of the trench becomes the same for the left sidewall and the right sidewall, and the characteristics of the semiconductor device are not affected. As a result, deviation of the characteristics of the semiconductor device is suppressed, enabling yield and product reliability to be enhanced. Further, when various patterns are formed, since alignment of the crystal axis direction <11-20> by the primary OF is unnecessary, a problem of the accuracy of the primary OF differing according to wafer manufacturer may be resolved.

In the embodiments above, various modifications are possible within a range not departing from the spirit of the present invention. For example, in the embodiments, dimensions, impurity concentrations, and the like of components may be variously set according to required specifications. Further, in the embodiments, although a MOSFET is described as an example, without limitation hereto, the present invention is applicable to a wide variety of silicon carbide semiconductor devices that conduct or block current by gate drive control based on a predetermined gate threshold voltage. For example, an IGBT may be given as an example of a gate-drive-controlled silicon carbide semiconductor device. Further, in the described embodiments, although a case is described in which silicon carbide is used as a wide bandgap semiconductor, other than silicon carbide, a wide bandgap semiconductor such as, for example, gallium nitride (GaN) may be used. In the embodiments, although a first conductivity type is assumed as an n-type and a second conductivity type is assumed as a p-type, the present invention is further implemented when the first conductivity type is a p-type and the second conductivity type is an n.

Conventionally, however, the accuracy of the crystal axis indicated by the primary OF is guaranteed within a 1-degree range or a 5-degree range and differs according to manufacturer. Moreover, even for a substrate of the same manufacture, consequent to the crystal ingot, the actual crystal axis of the substrate and the crystal axis indicated by the primary OF have angular deviations differing according to wafer. Therefore, when the primary OF is used as a reference to form a pattern, angular deviation from the actual crystal axis of the substrate may occur in the pattern. Moreover, errors such as mask deviation at the time of semiconductor device manufacture and angular deviation from luminous exposure deviation are compounded.

Figure 12A:
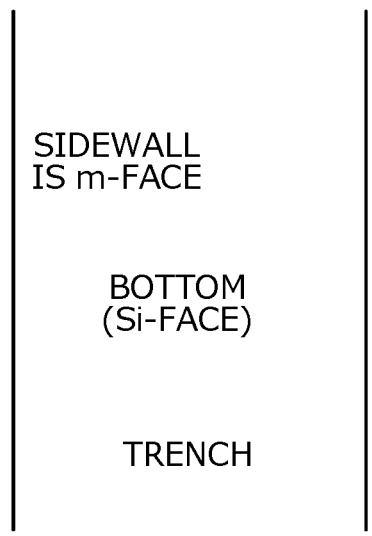
FIGS. 12A, 12B, and 12C are top views of a trench formed on a conventional silicon carbide semiconductor base.
Figure 12B:
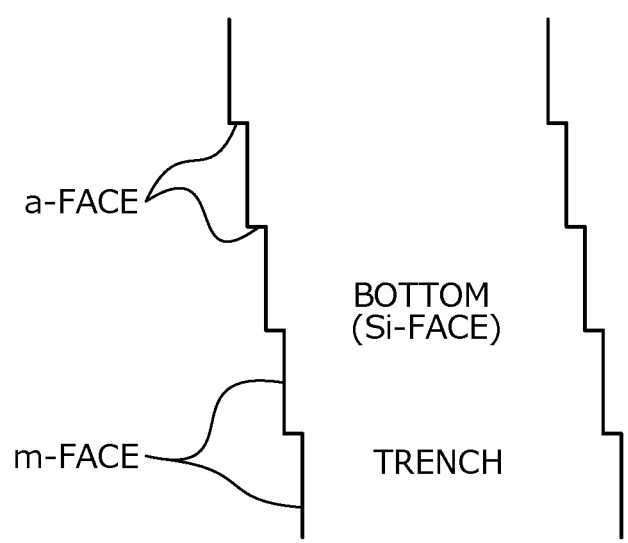
Figure 12C:
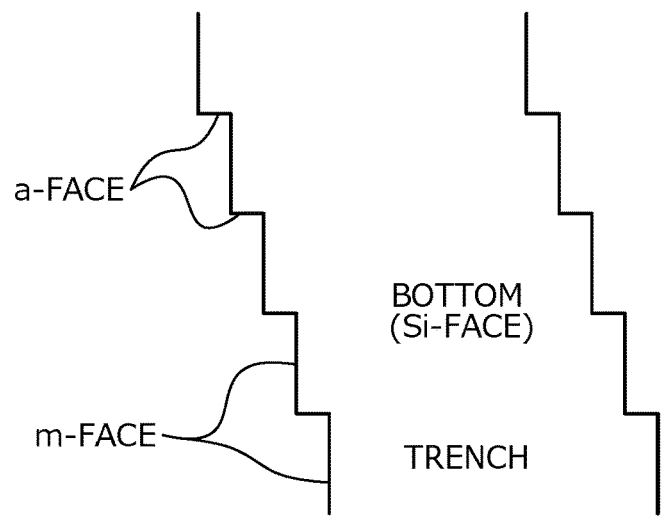

For example, in a vertical MOSFET having a trench structure, the trench is formed parallel to the primary OF, i.e., parallel to the crystal axis direction <11-20>. FIGS. 12A, 12B, and 12C are top views of a trench formed on a conventional silicon carbide semiconductor base. FIG. 12A depicts a case in which the primary OF and the crystal axis direction <11-20> coincide, an m-face of the 4H—SiC appears at the sidewall of the trench, and a Si-face of 4H—SiC appears at bottom of the trench. FIG. 12B depicts a case in which there is deviation between the primary OF and the crystal axis direction <11-20>, and in addition to the m-face of the 4H—SiC at the sidewall of the trench, an a-face of the 4H—SiC also appears. FIG. 12C depicts a case in which there is further deviation between the primary OF and the crystal axis direction <11-20>, and the area of the a-face appearing at the sidewall of the trench increases.

Figure 13A:
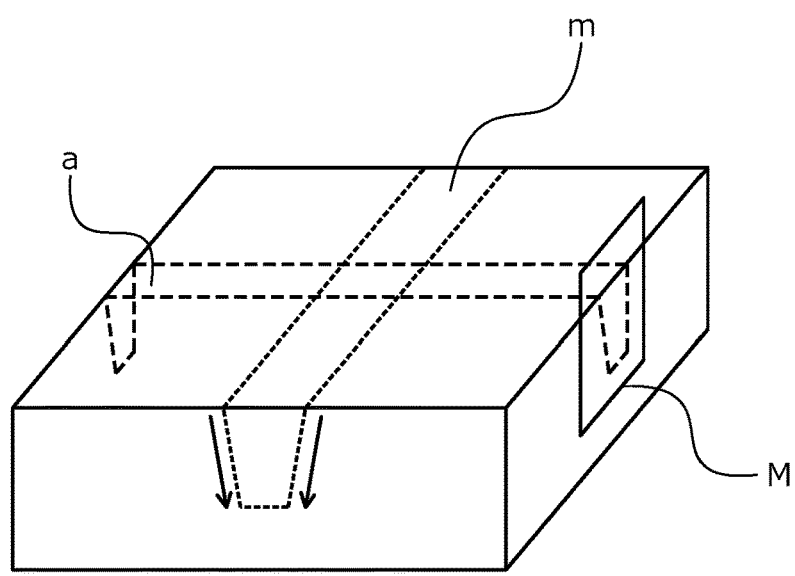
FIGS. 13A and 13B are diagrams depicting electron movement in a trench formed in a conventional silicon carbide semiconductor base.
Figure 13B:
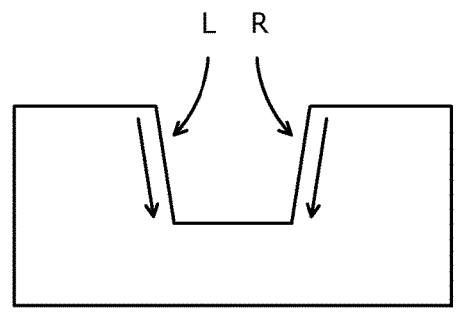

Here, FIGS. 13A and 13B are diagrams depicting electron movement in a trench formed in a conventional silicon carbide semiconductor base. In FIGS. 13A and 13B, arrows indicate current paths and these current paths are paths through which current flows in a channel region during the ON state, when a trench is formed. FIG. 13A is a perspective view of a trench having a sidewall of an m-face (dotted line portion indicated by "m") and a trench having a sidewall of an a-face (dashed line portion indicated by "a"). FIG. 13B is a cross-sectional view of a trench having a sidewall of an a-face. In particular, FIG. 13B is a cross-sectional view of a portion M encompassed by a solid line in FIG. 13A.

Since a silicon carbide semiconductor has an off-angle, the angle of the a-face with respect to the Si-face varies on the left and right sides of the trench (4 degrees off). For example, as depicted in FIG. 13B, a left sidewall L of the trench has a 5-degree slope on the Si-face side and a right sidewall R of the trench has a 13-degree slope on the Si-face side. On the other hand, the m-face has slope angles on the left and right sides of the trench that are the same.

Figure 14:
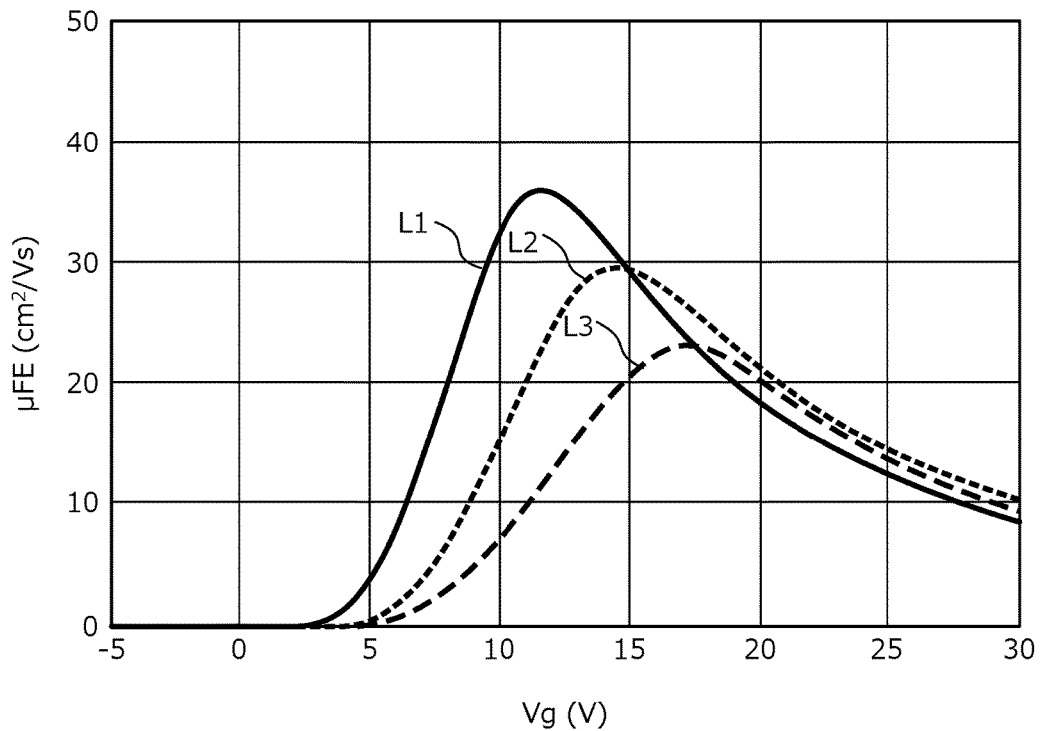
FIG. 14 is a graph of electron mobility in a conventional silicon carbide semiconductor base.

Here, FIG. 14 is a graph of electron mobility in a conventional silicon carbide semiconductor base. The vertical axis represents μFE (channel mobility) and the horizontal axis represents gate voltage Vg. In FIG. 14, L1 represents electron mobility of the a-face sloped 5 degrees on the Si-face side, L2 represents electron mobility of the m-face sloped 9 degrees on the Si-face side, and L3 represents electron mobility of the a-face sloped 13 degrees on the Si-face side. As depicted in FIG. 14, at the a-face sloped 5 degrees on the Si-face side and at the a-face sloped 13 degrees on the Si-face side, it is found that electron mobility differs even for the same a-face.

Therefore, when there is deviation between the primary OF and the crystal axis direction <11-20>, an a-face appears at the trench sidewall, the slope angles of the sidewall on the left and right sides of the trench come to differ, electron movement on the left and right sides of the trench differs, and the electrical characteristics do not match on the left and right sides. These differences in electrical characteristics affect the characteristics of the semiconductor device, arising in deviations in the characteristics of the semiconductor device.

According to the invention described above, on the silicon carbide semiconductor base, a mark is provided that indicates the crystal axis direction <11-20> of the silicon carbide substrate within a 1-degree margin of error, and more preferably within a 0.5-degree margin of error. Based on this mark, various patterns may be formed on the surface of the silicon carbide semiconductor base. When a trench pattern is formed based on this mark, for example, the trench pattern may be formed parallel to the crystal axis direction <11-20> with sufficiently high accuracy. Therefore, the appearance of the a-face at the sidewall of the trench does not occur and only the m-face appears, the mobility of the sidewall of the trench becomes the same at the left sidewall and the right sidewall, and characteristics of the semiconductor device are not affected. As a result, deviations in the characteristics of the semiconductor device are suppressed, enabling yield and product reliability to be enhanced. Further, when various patterns are formed, since there is no need for alignment of the crystal axis direction <11-20> by the primary OF, the problem of the accuracy of the primary OF differing according to wafer manufacturer may be resolved.

According to the silicon carbide semiconductor base, the method of crystal axis alignment in a silicon carbide semiconductor base, and the method of manufacturing a silicon carbide semiconductor device of the present invention, an effect is achieved in that a means of indicating the crystal axis direction with higher accuracy than the primary OF of a SiC wafer may be provided.

As described above, the silicon carbide semiconductor base, the method of crystal axis alignment in a silicon carbide semiconductor base, and the method of manufacturing a silicon carbide semiconductor device of the present invention are useful for power semiconductor devices used in power converting equipment such as converters and inverters, and power supply devices such as in various industrial machines and are particularly suitable for a silicon carbide semiconductor device having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor base comprising
an epitaxial layer formed on a front surface of a silicon carbide substrate, the epitaxial layer containing a silicon carbide, wherein
a mark is provided in the epitaxial layer, the mark indicating one edge of a stacking fault on the epitaxial layer, thereby indicating a crystal axis direction of the silicon carbide substrate within a margin of error of one degree.

2. The silicon carbide semiconductor base according to claim 1, wherein
the mark indicates the crystal axis direction of the silicon carbide substrate within a margin of error of 0.5 degrees.

3. The silicon carbide semiconductor base according to claim 1, wherein
the mark is provided at an end of the silicon carbide substrate.

4. The silicon carbide semiconductor base according to claim 1, wherein
a poly-type of the silicon carbide substrate is 4H—SiC.

5. A method of crystal axis alignment in a silicon carbide semiconductor base, the method comprising:
forming an epitaxial layer on a front surface of a silicon carbide substrate, the epitaxial layer containing a silicon carbide;
performing a step of detection of a stacking fault from the epitaxial layer;
confirming a crystal axis direction of the silicon carbide substrate from a detected stacking fault; and
creating a mark indicating the confirmed crystal axis direction.

6. The method according to claim 5, wherein
when no stacking fault is detected in the step of performing detection of a stacking fault, damage is applied to the epitaxial layer and the epitaxial layer is irradiated with ultraviolet rays so that a stacking fault appears.

7. The method according to claim 6, wherein
a site of the damage is within a predetermined distance from a secondary orientation flat provided at a position orthogonal to the primary orientation flat that indicates the crystal axis direction of the semiconductor substrate.

8. The method according to claim 5, wherein
the crystal axis direction of the silicon carbide substrate is confirmed using one edge of the stacking fault as a reference.

9. A method of manufacturing a silicon carbide semiconductor device, the method comprising:
forming a first epitaxial layer on a front surface of a silicon carbide substrate, the first epitaxial layer containing a silicon carbide of a first conductivity type;
forming a second epitaxial layer on a first side of the first epitaxial layer opposite a second side of the first epitaxial layer, the second side facing the silicon carbide substrate, the second epitaxial layer containing a silicon carbide of a second conductivity type;
detecting a stacking fault from the second epitaxial layer;
confirming a crystal axis direction of the silicon carbide substrate from the detected stacking fault;
creating a mark indicating the confirmed crystal axis direction;

selectively forming a first semiconductor region of the first conductivity type, in the second epitaxial layer, the first semiconductor region having an impurity concentration higher than that of the first epitaxial layer;

forming a trench penetrating the first semiconductor region and the second epitaxial layer, and reaching the first epitaxial layer;

forming in the trench, a gate electrode provided via a gate insulating film;

forming a first electrode to contact the first semiconductor region and the second epitaxial layer; and forming a second electrode on a rear surface of the silicon carbide substrate, wherein in forming the trench, a sidewall of the trench is formed parallel to the crystal axis direction, based on the mark indicating the crystal axis direction.

10. The method according to claim 9, wherein the silicon carbide semiconductor device is a MOSFET (Metal Oxide Semiconductor Field Effect Transistor).

11. The method according to claim 9, wherein the silicon carbide semiconductor device is an IGBT (Insulated Gate Bipolar Transistor).

* * * * *